A system for uniformly and controllably heating the active surface of a semiconductor wafer or substrate during processing. The present invention may include a radiation energy source provided, which is enclosed or substantially surrounded by a reflective/absorptive surface, which both reflects and absorbs the radiation, emitted from the energy source. In accordance with the present invention, the resultant energy output as seen by the wafer is substantially free of non-uniformity.

(12) United States Patent
Yoo

(10) Patent No.: US 6,376,806 B2
(45) Date of Patent: Apr. 23, 2002

(54) FLASH ANNEAL

(76) Inventor: Woo Sik Yoo, 3090 Stelling Dr., Palo Alto, CA (US) 94303

( * ) Notice: Subject to any disclaimer, the term of this patent is extended or adjusted under 35 U.S.C. 154(b) by 0 days.

(21) Appl. No.: 09/910,298
(22) Filed: Jul. 20, 2001

Related U.S. Application Data

(63) Continuation-in-part of application No. 09/568,450, filed on May 9, 2000.

(51) Int. Cl.⁷ ................................................ A21B 1/00
(52) U.S. Cl. .................. 219/411; 219/390; 219/405; 219/118; 219/724; 219/250; 219/492.22; 219/362; 219/298
(58) Field of Search ................................ 219/390, 405, 219/411; 118/724, 725, 50.1; 392/416, 418; 250/492.22; 362/298, 301, 302, 304

(56) References Cited

U.S. PATENT DOCUMENTS

| | | | |
|---|---|---|---|
| 4,356,384 A | 10/1982 | Gat | 219/347 |
| 4,436,985 A | 3/1984 | Weber | 219/388 |
| 4,707,217 A | 11/1987 | Aklufi | 156/617 R |
| 4,755,654 A | 7/1988 | Crowley et al. | 219/405 |
| 5,073,698 A * | 12/1991 | Stultz | 219/405 |
| 5,577,157 A * | 11/1996 | Sopori | 392/416 |
| 5,722,761 A | 3/1998 | Knight | 362/96 |
| 5,756,369 A | 5/1998 | Aronowitz et al. | 438/16 |
| 5,811,327 A | 9/1998 | Funai et al. | 438/166 |
| 5,840,118 A | 11/1998 | Yamazaki | 117/103 |
| 5,892,332 A | 4/1999 | Drews et al. | 315/209 CD |
| 5,893,952 A | 4/1999 | Aronowitz et al. | 118/725 |
| 5,937,282 A | 8/1999 | Nakajima et al. | 438/149 |
| 6,080,965 A * | 6/2000 | Osawa | 219/405 |
| 6,144,171 A | 11/2000 | Clements et al. | 315/289 |

FOREIGN PATENT DOCUMENTS

JP      11 097370      4/1999      ........... H01L/21/26

* cited by examiner

Primary Examiner—Philip H. Leung
Assistant Examiner—Shawntina T Fuqua
(74) Attorney, Agent, or Firm—Skjerven Morrill MacPherson LLP

(57) ABSTRACT

34 Claims, 13 Drawing Sheets

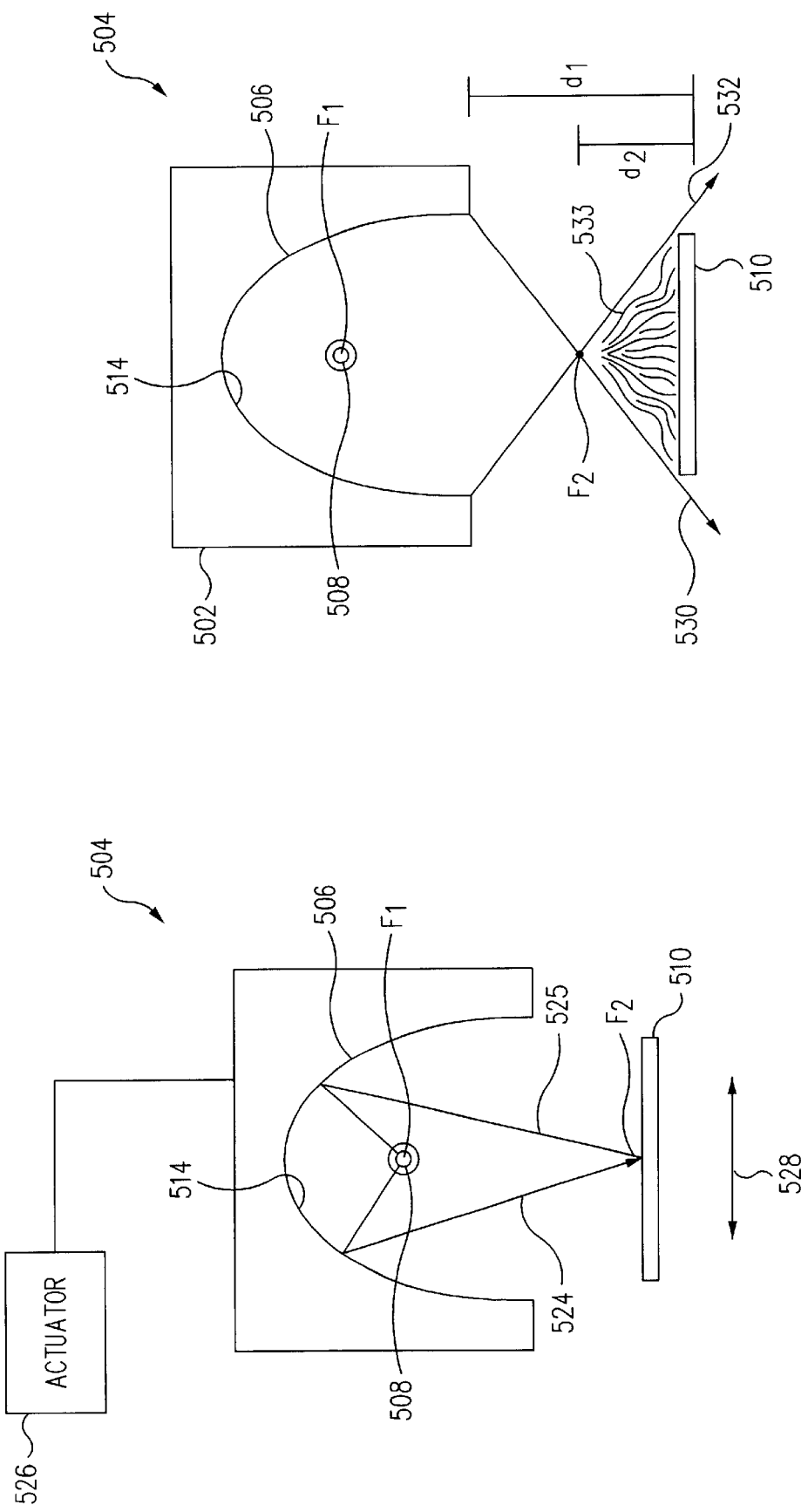

FLASH ANNEAL

This application is a Continuation-in-Part of U.S. patent application Ser. No. 09/568,450, filed May 9, 2000, now U.S. Pat. No. 6,337,467, which is herein incorporated by reference for all purposes.

BACKGROUND OF THE INVENTION

1. Field of the Invention

This invention generally relates to semiconductor manufacturing equipment and, more particularly, to a system and method for rapid thermal processing of a semiconductor wafer.

2. Related Art

To make semiconductor devices of decreased dimensions, new processing and manufacturing techniques have had to be developed. One important requirement for the new techniques is to be able to reduce the amount of time that a semiconductor wafer is exposed to high temperatures during processing. One such processing technique designed to address this requirement is known as Rapid Thermal Processing (RTP). The rapid thermal processing technique, typically includes quickly raising the temperature of the wafer and holding it at that temperature for a time long enough to successfully perform a fabrication process, while avoiding such problems as unwanted dopant diffusion that would otherwise occur at the high processing temperatures.

Generally, conventional RTP systems use a light source and reflectors to heat the bulk of the semiconductor wafer. The light source is usually a bank of Halogen lamps that emit radiation energy that is focused on the wafer by the reflectors.

Conventional Halogen lamp-based RTP systems have considerable drawbacks with regard to achieving and maintaining a uniform temperature distribution across the active layer of the wafer surface. For example, the Halogen lamp has a filament, which generates broadband radiation. By applying more power to the filament, the intensity of the lamp can be increased. However, silicon wafers are heated using a useable band of short wavelengths, and are otherwise transparent to wavelengths outside of this band. The radiation from the lamp remains mostly outside of the useable wavelength band during typical halogen lamp operation. As a consequence, much of the applied power is wasted.

Another drawback to filament type lamps is that they generally create a broad wavelength distribution that is independently uncontrollable. Consequently, temperature fluctuations occur on the surface of the wafer which may cause crystal defects and slip dislocations in the wafer at high temperatures (e.g. ~1000° C.) and under various lamp configurations.

One particular solution to the drawbacks of Halogen lamp-based systems is disclosed in U.S. Pat. No. 5,893,952. In the '952 patent, an apparatus is described for rapid thermal processing of a wafer using a narrow band beam of electromagnetic radiation generated by a high wattage laser. The beam is directed at the wafer, through a thin absorption film, which absorbs substantially all the energy from the beam, which, in turn, radiates heat to the wafer. Unfortunately, the apparatus described above has some limitations and drawbacks. For example, the thickness of the thin film must be accurately determined. If the thin film is too thin, energy from the beam may be transmitted directly to the wafer, or if the thin film is too thick the film may not heat up fast enough for rapid thermal processing. A film must be used that does not degrade over time, and must not sputter, bubble, or degas when heated, otherwise non-uniform absorption will result. Because of the requirements placed on the thin absorption film, the materials for this film are limited. As a result, the same RTP apparatus may heat wafers differently and unpredictably, which wastes both time and materials.

SUMMARY

The present invention provides a system and method for uniformly and controllably heating the active surface of a semiconductor wafer or substrate during processing. The present invention may include, as described in greater detail below, a radiation energy source provided, which is enclosed or substantially surrounded by a reflective/absorptive surface, which both reflects and absorbs the radiation, emitted from the energy source such that the resultant energy output as seen by the wafer is substantially free of non-uniformity. Advantageously, the resultant energy can be uniformly spread over the wafer to heat only the active layer of the wafer surface. Because the resultant energy is uniform over the diameter of the wafer there is no significant heating overlap.

In accordance with the present invention the resultant energy can be provided at a very high intensity such that only a short exposure time is necessary to heat the active layer of the substrate. Thus, the process can be referred to as a "flash" anneal process, which can include crystallizing the active layer of the substrate, doping the active layer, or otherwise heat treating the active layer. Optionally, the present invention can provide a continuous heat exposure to allow the bulk of the substrate to be heated.

In one aspect of the invention, a system is provided for rapid thermal processing of a substrate. The system includes a radiation energy source surrounded by a reflector, which causes radiation energy to impinge on a surface of a substrate to heat an active layer of the substrate. The surface of the substrate is impinged on by the radiation energy for a substantially instantaneous reaction time.

In another aspect of the invention, a method for rapid thermal processing of a substrate is provided including providing a chamber including a radiation energy source and a reflector; and focusing radiation energy from the radiation energy source at a first focal point to impinge on a surface of a substrate for a substantially instantaneous time to heat an active layer of the substrate.

In yet another aspect of the present invention, a method is provided for rapid thermal processing of a substrate. The method includes providing a chamber including a radiation energy source and a reflector; raising the power level of the radiation energy source to a peak power level to expose an active layer of a substrate to a first radiation energy for a first time duration; and thereafter maintaining a second power level of the radiation energy source, less than the first power level, to expose a bulk of the substrate to a second radiation energy for a second time duration.

The system and method of the present invention can be used to heat only the active layer of the substrate surface, thus the process is advantageous for implant anneal applications, such as shallow junction, ultra shallow junction, and source drain anneal. The RTP system and method may also be used effectively for thermal donor annihilation, re-crystallization, and impurity doping. Moreover, since the bulk of the semiconductor wafer need not be heated during the heating process, unless desired, the amount of power used by the RTP system can be reduced to less than 50 kWh, preferably, less than about 10 kWh. Similarly, processing times maybe reduced since only the active surface of the wafer is being heated.

These and other features and advantages of the present invention will be more readily apparent from the detailed description of the preferred embodiments set forth below taken in conjunction with the accompanying drawings.

BRIEF DESCRIPTION OF THE FIGURES

FIG. 6 is a simplified illustration of a reflector assembly for use with the flash anneal system of FIG. 5 in accordance with the present invention;

FIG. 7 is a simplified illustration of an alternative embodiment of the reflector assembly of FIG. 6 in accordance with the present invention;

DETAILED DESCRIPTION

As used herein, the word "flash" includes it ordinary meaning as generally understood by those of ordinary skill in the art. This definition includes the definition that flash means to give off light suddenly or substantially instantaneous (or in transient bursts) for a duration of time between about 1 nanosecond and about 10 seconds.

Figure 1B:
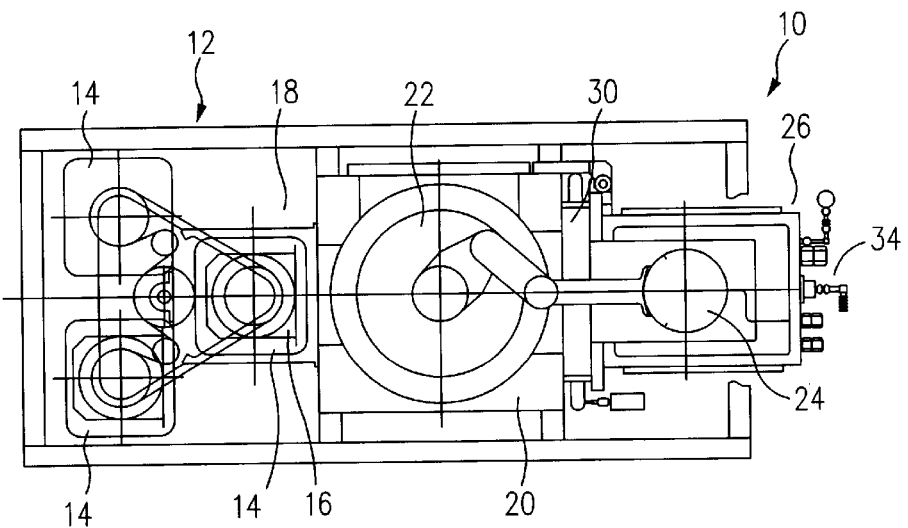
FIGS. 1A and 1B are schematic illustrations of a side view and top view, respectively, of one embodiment of a semiconductor wafer processing system that establishes a representative environment of the present invention.
Figure 1A:
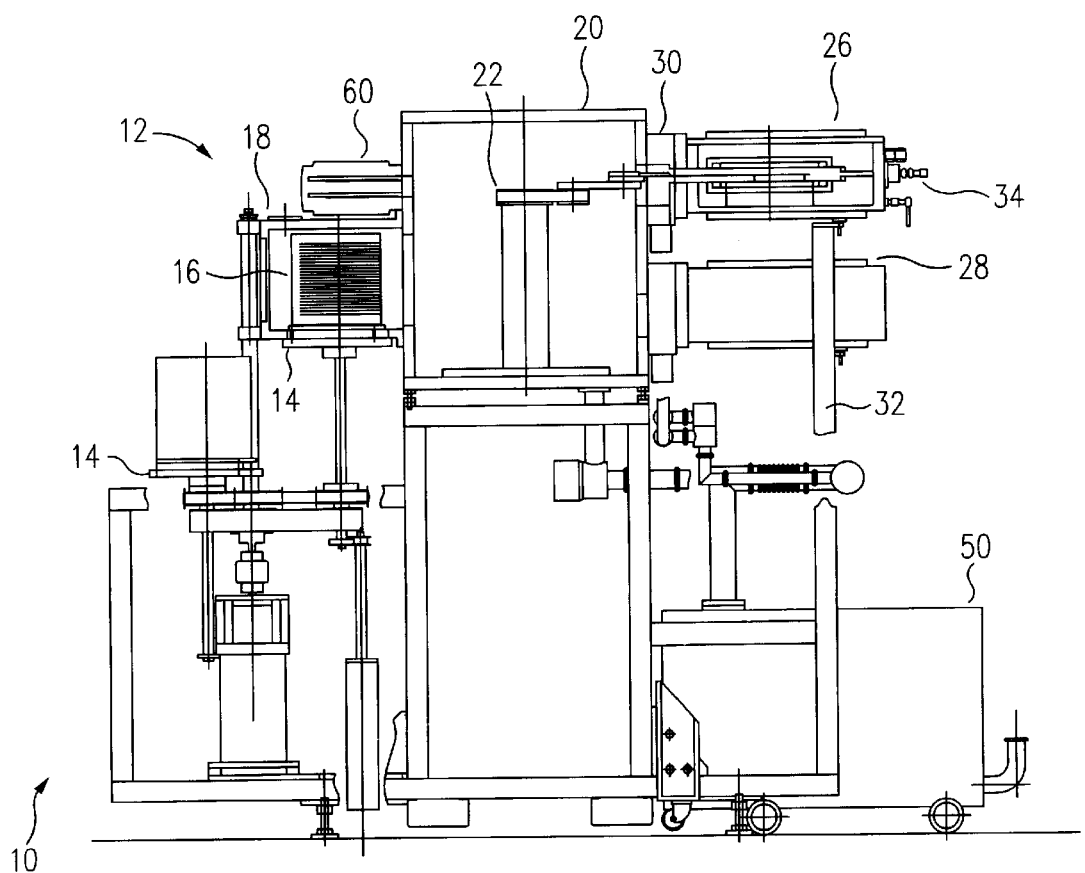

FIGS. 1A and 1B are schematic illustrations of a side view and top view, respectively, of one embodiment of a semiconductor wafer processing system 10 that establishes a representative environment of the present invention. The representative system is fully disclosed in co-pending U.S. patent application Ser. No. 09/451,677, filed Nov. 30, 1999, which is herein incorporated by reference for all purposes.

Processing system 10 includes a loading station 12 which has multiple platforms 14 for supporting and moving a wafer cassette 16 up and into a loadlock 18. Wafer cassette 16 may be a removable cassette which is loaded into a platform 14, either manually or with automated guided vehicles (AGV). Wafer cassette 16 may also be a fixed cassette, in which case wafers are loaded onto cassette 16 using conventional atmospheric robots or loaders (not shown). Once wafer cassette 16 is inside loadlock 18, loadlock 18 and transfer chamber 20 are maintained at atmospheric pressure or else are pumped down to vacuum pressure using a pump 50. A robot 22 within transfer chamber 20 rotates toward loadlock 18 and picks up a wafer 24 from cassette 16. A reactor or thermal processing chamber 26, which may also be at atmospheric pressure or under vacuum, accepts wafer 24 from robot 22 through a gate valve 30. Optionally, additional reactors may be added to the system, for example reactor 28. Robot 22 then retracts and, subsequently, gate valve 30 closes to begin the processing of wafer 24. After wafer 24 is processed, gate valve 30 opens to allow robot 22 to pick-up and place wafer 24 into a cooling station 60. Cooling station 60 allows the newly processed wafers, which may have temperatures upwards of 100° C., to cool before they are placed back into a wafer cassette in loadlock 18.

In accordance with the present invention, reactors 26 and 28 are RTP reactors, such as those used in thermal anneals, dopant diffusion, thermal oxidation, nitridation, chemical vapor deposition, and similar processes. Reactors 26 and 28 are generally horizontally displaced, however in a preferred embodiment, reactors 26 and 28 are vertically displaced; (i.e. stacked one over another) to minimize floor space occupied by system 10. Reactors 26 and 28 are bolted onto transfer chamber 20 and are further supported by a support frame 32. Process gases, coolant, and electrical connections may be provided through the rear face of the reactors using interfaces 34.

Figure 2A:
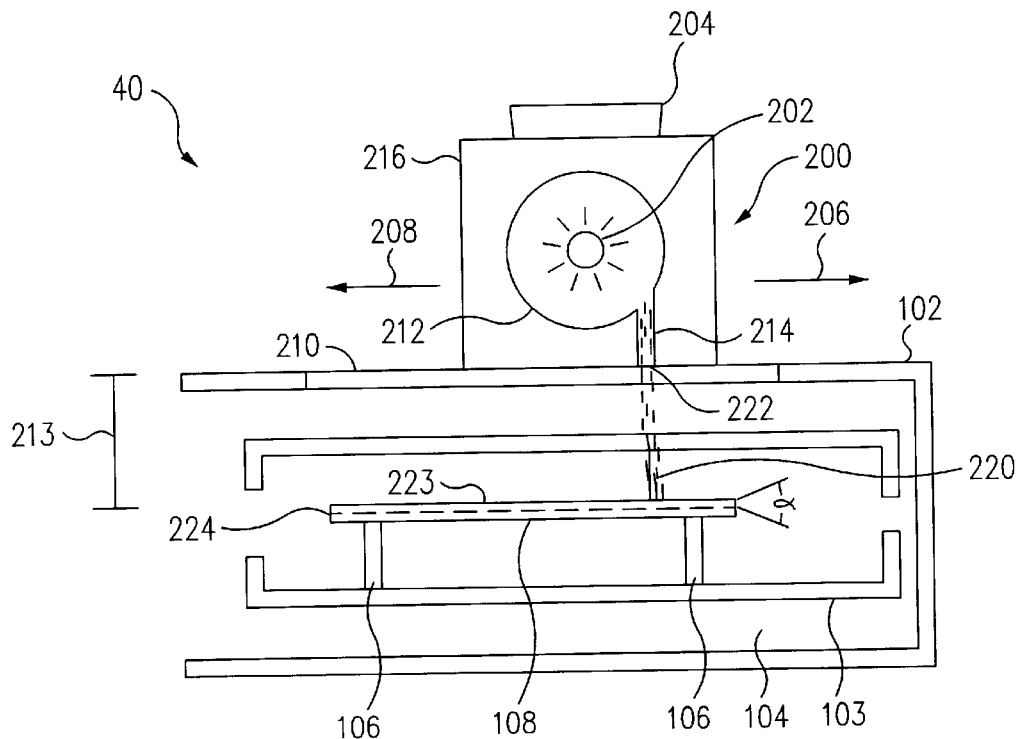
FIG. 2A is a simplified illustration of an RTP reactor system in accordance with the principles of the present invention.

FIG. 2A is a simplified illustration of an embodiment of RTP reactor system 40 in accordance with the principles of the present invention. In this embodiment, reactor system 40 includes a process chamber 102 and a scanner assembly 200. Scanner assembly 200 may be positioned proximate to process chamber 102, such that in operation, the scanner assembly can be made to adequately scan the wafer disposed in the chamber.

In a preferred embodiment, process chamber 102 may include a closed-end tube 103, defining an interior cavity 104. Within tube 103 are wafer support posts 106, typically three (of which two are shown), to support a single wafer 108. An opening or aperture (not shown) on one end of tube 103, provides access for the loading and unloading of wafer 108 before and after processing. The aperture may be a relatively small opening, but large enough to accommodate a wafer of between about 0.5 to 0.8 mm thick and up to 300 mm (~12 in.) in diameter, and the arm and end effector of robot 22. Preferably, the aperture is no greater than between about 18 mm and 22 mm, preferably 20 mm. The relatively small aperture size helps to reduce radiation heat loss from tube 103.

Because wafer 108 is loaded and un-loaded using robot 22, tube 103 requires no internal moving parts to position wafer 108, such as lift pins, actuators, and the like. Thus, tube 103 may be constructed with a minimal internal volume-surrounding wafer 108. In a preferred embodiment, the volume of interior cavity 104 is usually no greater than about 1.0 m³, and preferably the volume is no greater than about 0.3 m³. Accordingly, the small tube volume allows reactor system 40 to be made smaller, and as a result, system 10 may be made smaller, requiring less floor space. Preferably, tube 103 is made of a transparent quartz or similar material.

FIG. 2A also illustrates scanner assembly 200, which may be used in conjunction with a radiation energy source 202, to provide rapid thermal processing of semiconductor after 108. Scanner assembly 200 includes a housing 216 which supports an actuator 204, a reflecting chamber 212, and a radiation outlet channel 214. The external dimensions of housing 216 are determined by the application. For example, the length of housing 216 may be at least as great, or greater than the diameter of wafer 108.

Actuator 204 provides a conventional means for making scanner assembly 200 operable to scan wafer 108. Actuator 204 may be configured to provide a back and forth scanning motion, as indicated in FIG. 2A by arrows 206 and 208, along a scanning length of tube 103. Actuator 204 may include, but is not limited to, conventional drivers and motion translation mechanisms, such as linear motors, stepper motors, hydraulic drives, and the like, and gears, pulleys, chains, and the like.

Figure 2B:
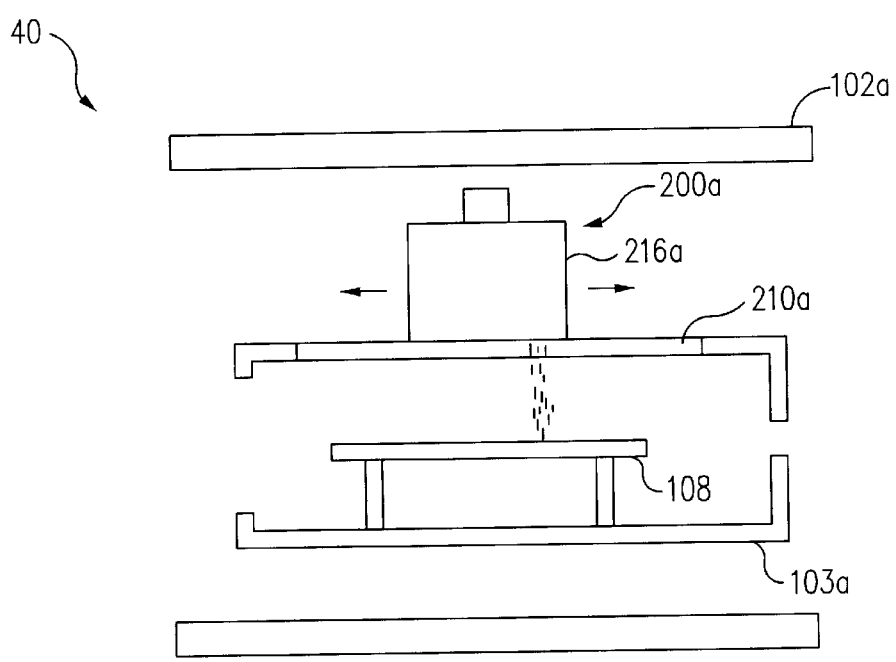
FIG. 2B is a simplified illustration of an RTP reactor system in accordance with an alternative embodiment of the present invention.

In the embodiment shown in FIG. 2A, scanner assembly 200 may be mounted external to both process chamber 102 and tube 103. Scanner assembly 200 is positioned above an optical window 210, which is provided along the scanning length of chamber 102 (i.e. at least as great as the diameter of wafer 108) to allow the radiation energy emitted from housing 216 to enter tube 103 and impinge on wafer 108. In an alternative embodiment shown in FIG. 2B, the scanning motion of scanner assembly 200a may take place internal to process chamber 102a, but external to tube 103a. Scanner assembly 200a is positioned above optical window 210a, formed on tube 103a along the scanning length (i.e. at least as great as the diameter of wafer 108) to allow the radiation energy emitted from housing 216a to enter tube 103a and impinge on wafer 108.

Figure 2C:
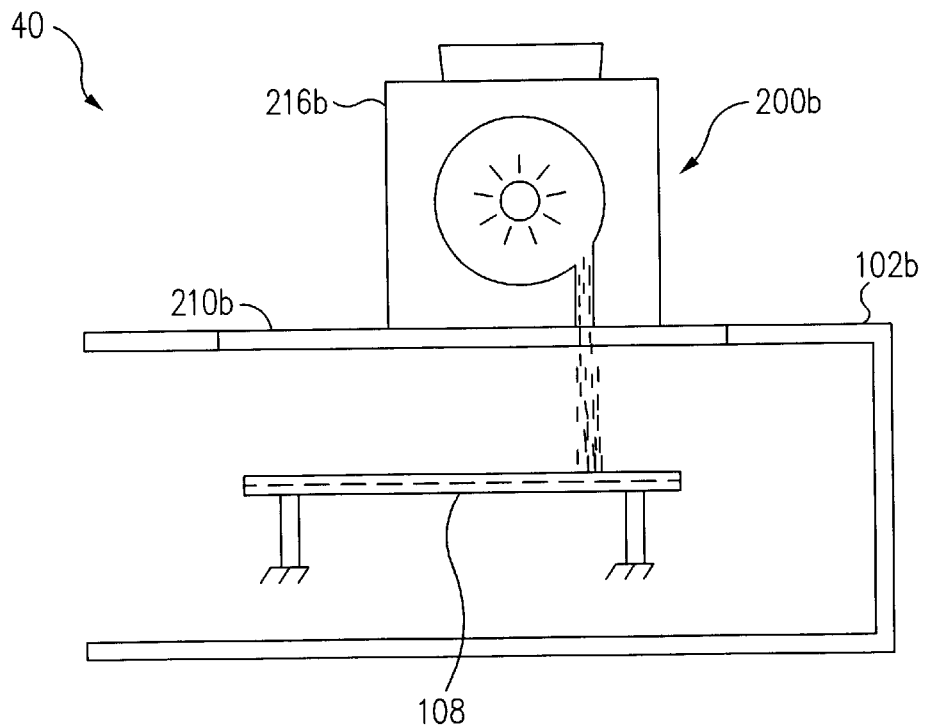
FIG. 2C is a simplified illustration of an RTP reactor system in accordance with an alternative embodiment of the present invention.

In yet another embodiment, shown in FIG. 2C, scanner assembly 200b may be mounted external to process chamber 102b, with no process tube. In this embodiment, scanner assembly 200b is positioned above optical window 210b, which is provided along the scanning length of chamber 102b (i.e. at least as great as the diameter of wafer 108) to allow the radiation energy emitted from housing 216b to impinge on wafer 108.

Optical window 210 (or 210a) may be made of any material that allows for the transmission of the radiation energy, preferably quartz. Window 210 may have a thickness of between about 1 mm and about 5 mm and a diameter that is at least as great or greater than wafer 108.

Whether the scanner assembly is positioned inside or outside of the tube, the distance between the surface of the wafer and the scanner assembly, indicated in FIG. 2A as gap 213, should be no greater than about 50 mm, preferably between about 10 mm and 25 mm. The relatively small gap 213 ensures that adequate control of the temperature/radiation energy distribution across wafer 108 is maintainable. A larger gap 213 may cause some of the radiation energy to escape before it impinges on after 108.

As further illustrated in FIG. 2A, reflective chamber 212 and radiation outlet channel 214 are disposed within housing 216. Radiation source 202 is disposed within reflective chamber 212, typically positioned such that substantially all of the broadband radiation is allowed to impinge on an internal surface 218 of the chamber. In one embodiment, radiation energy source 202 may be a high-intensity lamp of the type conventionally used in lamp heating operations. In a preferred embodiment, radiation energy source 202 is a filament-less lamp, such as a Xe arc lamp. Typical, power requirements for the preferred lamp 202 of the present invention are between about 500 Watts and about 50 kWatts.

The energy emitted from lamp 202 impinges inner surface 218 of chamber 212, which is highly reflective of certain wavelengths and absorptive or non-reflective of others. In one embodiment, surface 218 is coated with a material, which has the reflecting/absorbing characteristic. For example, surface 218 may be coated with gold or silver, where the silver is further coated with a protection coating, such as SiN or any transparent coating, which prohibits oxidation of the silver. Preferably, the coating efficiently reflects wavelengths of less than 900 nm, to produce an average wavelength of between about 900 nm and about 200 nm.

Figure 3:
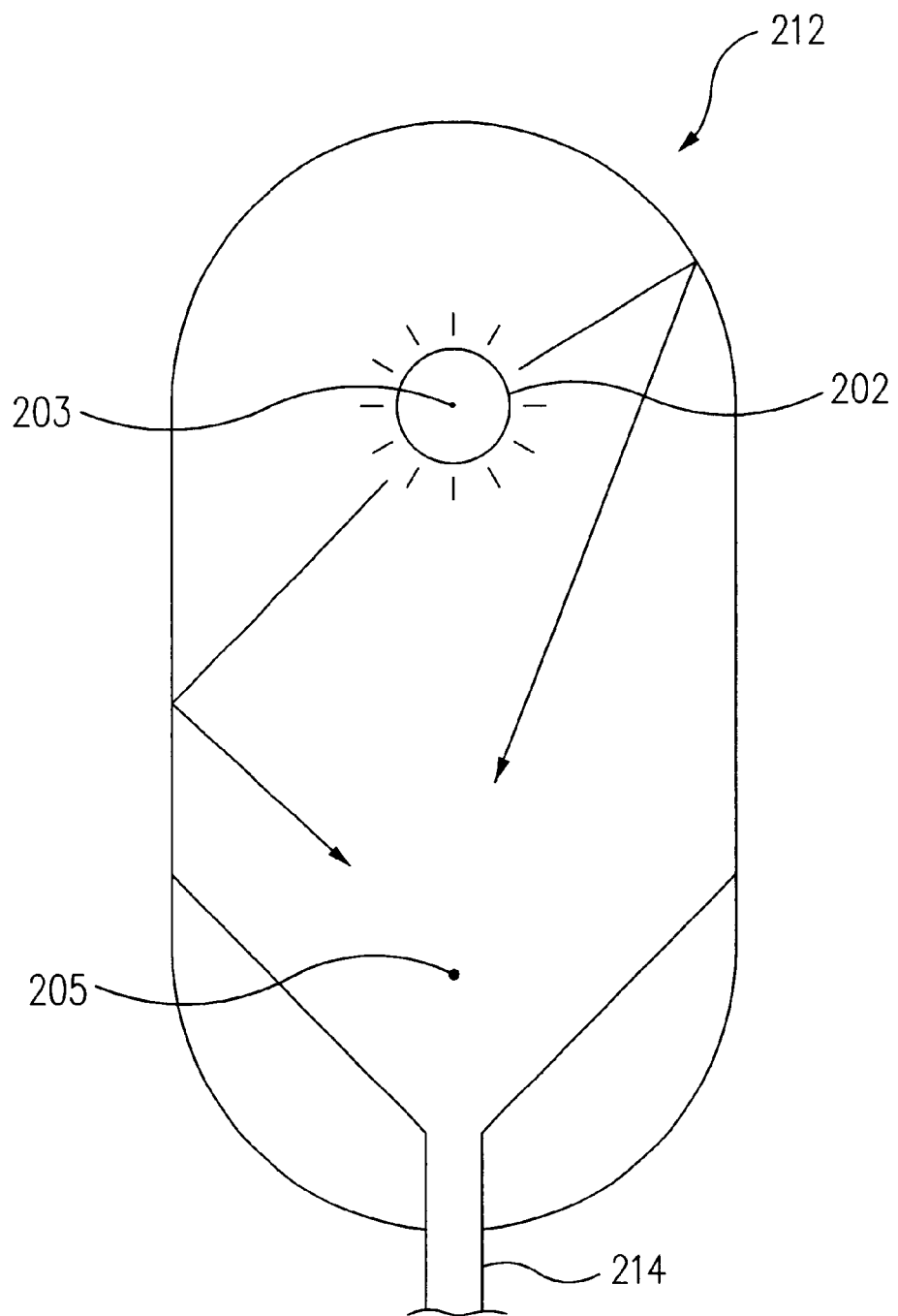
FIG. 3 is a simplified illustration of an embodiment of a radiation chamber in accordance with the present invention.

Chamber 212, which may be formed into any suitable geometric shape. For example, as shown in FIG. 2A, chamber 212 may be a round chamber. In a round chamber 212 light energy can be focused at the center of chamber 212 and directed toward radiation outlet channel 214, described below. In this example, radiation energy source 202 can be off-center in chamber 212 to ensure that the focused light energy does not over heat energy source 202. FIG. 3 shows an alternative example of chamber 212, which may be formed into an elliptical chamber. Elliptical chamber 212 can have two focal points. Energy source 202 can be positioned at a first focal point 203, such that the light energy is focused at the second focal point 205 and directed to radiation outlet channel 214.

Referring again to FIG. 2A, the narrow-band energy escapes from chamber 212 through radiation outlet channel 214. Radiation outlet channel 214 can be about 5 mm to 20 mm long; preferably about 10 mm long, to adequately direct the radiation energy along the desired path. Radiation outlet channel 214 has an opening or slit 222 formed on the end of the channel which allows a beam 220 of the radiation energy to escape housing 216. Slit 222 is designed to shape beam 220 as desired, such that an optimal mount of energy may be focused on wafer 108. In a preferred embodiment, slit 222 may be a rectangular opening, which extends the length of scanner assembly 200, and is as great, or greater than the diameter of wafer 108. The size of the opening should be small enough to minimize the amount of energy, which will naturally disperse at the slit opening. Thus, slit 222 may have a width of between about 1 mm and 10 mm; preferably 2 mm. As beam 222 is scanned over wafer 108, a uniform temperature distribution is created across the surface of wafer 108, which heats an active layer 224 of the wafer.

Figure 2D:
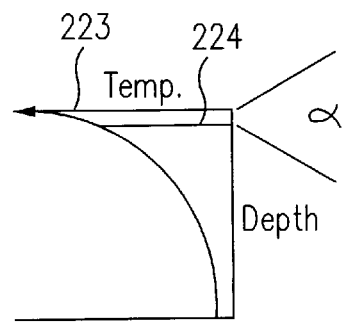
FIG. 2D is a simplified illustration of the active layer of a semiconductor wafer in accordance with principles of the present invention.

Referring now to FIGS. 2A and 2D, active layer or device layer 224 is a portion of wafer 108, which extends from surface 223 of wafer 108 down to a depth a below surface 223. The depth $\alpha$ is typically between about 0.05 $\mu$m and 1 mm, but will vary with the process and device feature size. Active layer 224 is well known in the semiconductor manufacturing industry as that portion of the wafer in which semiconductor devices are formed, such as transistors, diodes, resistors, and capacitors.

It should be understood that the temperature to which active layer 224 is heated is a function of the relationship between the speed at which scanner assembly 200 is moved across wafer 108 and the power supplied to lamp 202. In an exemplary embodiment, the temperature of active layer 224 may range from between about 500° C. to about 1200° C. To achieve these temperatures, the scan rate may vary between about 1 mm/sec to about 100 mm/sec at 500 watts to 50 kwatts. The slower the scan rate, the less power is required. In one embodiment, wafer 108 can be pre-heated, for example, to about 300° C., such that the processing of active layer 224 begins at the higher temperature, which reduces processing time and saves energy.

Heating active layer 224 using reactor system 40 increases the diffusion rate and solubility of active layer 224. Thus, a shallow doped region may be created in active layer 224. Doping the active layer includes scanning active layer 224 to a process temperature, for example, from between about 500° C. to about 1200° C., in an environment of a doping compound, such as boron, phosphorus, nitrogen, arsenic, $B_2H_6$, $PH_3$, $N_2O$, NO, $AsH_3$, and $NH_3$. The concentration of the compound may range from about 0.1% to about 100% relative to a carrier gas, such as $H_2$, $N_2$ and $O_2$ or a non-reactive gas, such as argon or helium. Higher concentrations of the compound can speed up the doping process and/or increase the dopant concentration within the active layer.

Figure 4:
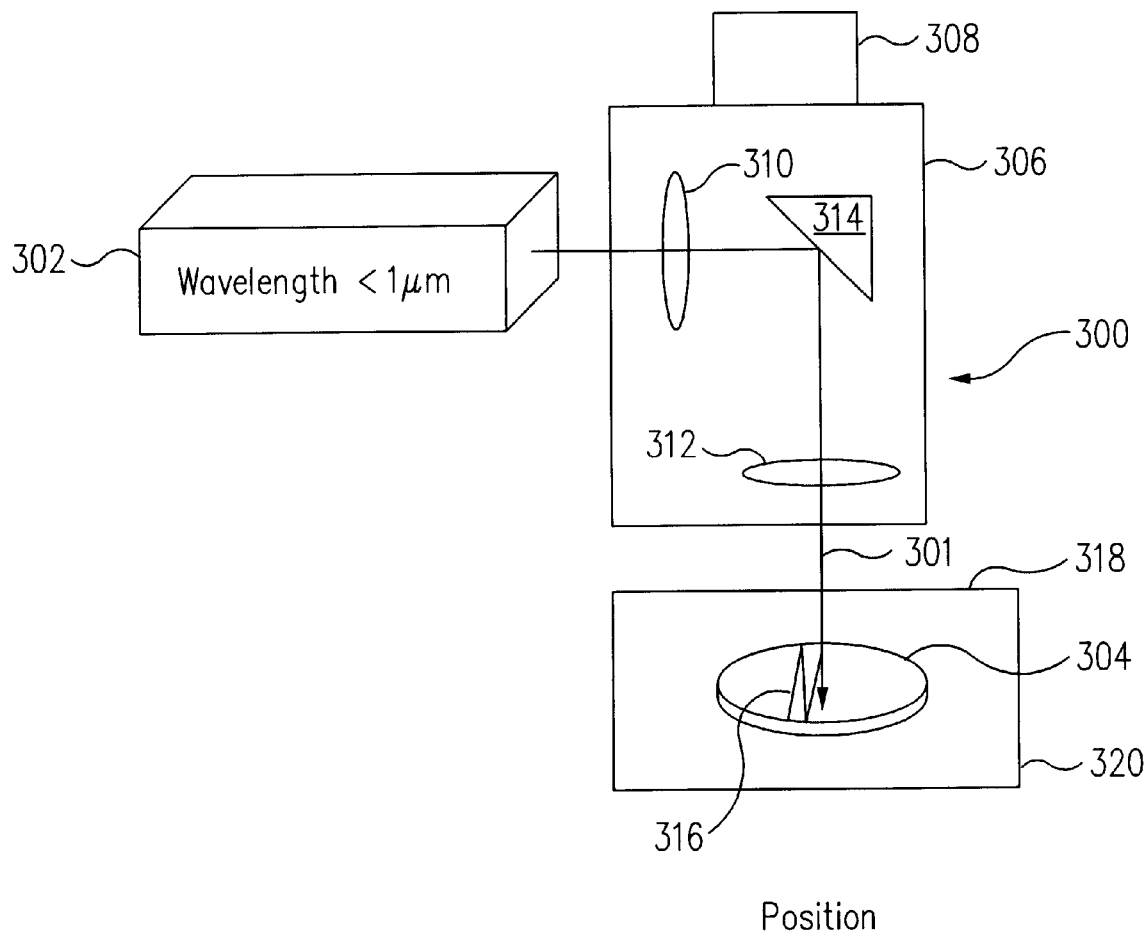
FIG. 4 is a simplified illustration of another embodiment of the present invention.

FIG. 4 is a simplified illustration of yet another embodiment of the present invention. In this embodiment, scanner assembly 300 includes a high intensity pulse or continuous wave laser 302 to provide rapid thermal processing of semiconductor wafer 304. Scanner assembly 300 also includes a laser energy focusing assembly 306 and an actuator 308. The components of scanning assembly 300 may be enclosed in a single housing, which is mountable on to a process chamber 320 in a manner similar to the embodiments described above in FIG. 2A.

Laser focusing assembly 306 includes a first focusing lens 310, a second focusing lens 312, and mirror 314. Focusing assembly operates in a well-known, conventional manner to focus the laser energy 301 from laser 302 onto wafer 304. The laser energy 301 from laser 302 can have a wavelength of less than 1 $\mu$m.

Actuator 308 provides a conventional means for making scanner assembly 300 operable to scan wafer 304. Actuator 308 may be configured to move laser 302 and focusing assembly 306 to provide a back and forth scanning motion across wafer 304, as indicated in FIG. 4 by arrow 316. Alternatively, only mirror 314 may be moved to cause the laser scanning of wafer 304. In yet another alternative embodiment, wafer 304 may be made to move, such that a stationary beam 301 can be made to scan the wafer surface. Actuator 308 may include, but is not limited to, conventional drivers and motion translation mechanisms, such as linear motors, stepper motors, hydraulic drives, and the like, and gears, pulleys, chains, and the like. In one embodiment, scanner assembly 300 is positioned above an optical window 318, which is provided along the scanning length of process chamber 320 to allow the laser energy to enter process chamber 320 and impinge on wafer 304. Window 318 may be made of any material that allows for the transmission of laser energy 301; preferably transparent quartz. Window 318 may have a thickness of between about 1 and about 5 mm and a diameter that is at least as great or greater than wafer 304.

Figure 5A:
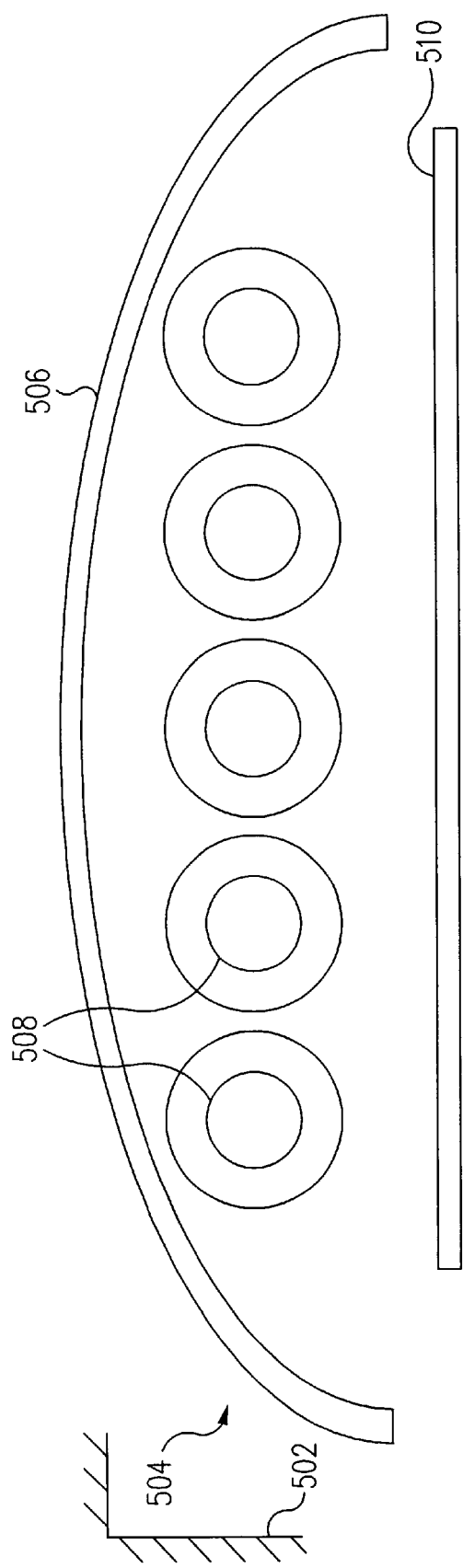
FIGS. 5A and 5B are simplified illustrations of an embodiment of a flash anneal system in accordance with the present invention.

FIG. 5A is a simplified illustration of an embodiment of an RTP reactor system 500 in accordance with the principles of the present invention. In this embodiment, reactor system 500 includes a process chamber 502 and a reflector assembly 504. Reflector assembly 504 may include a reflector 506 and a radiation energy source 508. Reflector assembly 504 may be positioned within process chamber 502 proximate to a wafer 510, such that in operation, reflector assembly 504 can be made to adequately process wafer 510. In one embodiment, radiation energy source 508 can be a high-intensity lamp of the type conventionally used in lamp heating operations. In this embodiment, radiation energy source 508 is a filament-less lamp, such as a Xe arc lamp hereinafter "lamp 508"). Lamp 508 can be any suitably shaped lamp, for example, a tube shaped lamp that has a length at least as long as the diameter of wafer 510. In one embodiment, lamp 508 can be surrounded by a flow tube 512. Flow tube 512 can contain a cooling fluid 522, for example, deionized water. Cooling fluid 522 is used to keep lamp 508 from overheating during operation. For example, cooling fluid can keep the temperature of lamp 508 under 100° C. to keep any quartz components of lamp 508 from melting. In another embodiment, cooling fluid 522 can be mixed with a non-conductive die. The non-conductive die can act as a filter to keep only certain wavelengths from emanating from lamp 508 through flow tube 512.

Figure 5B:
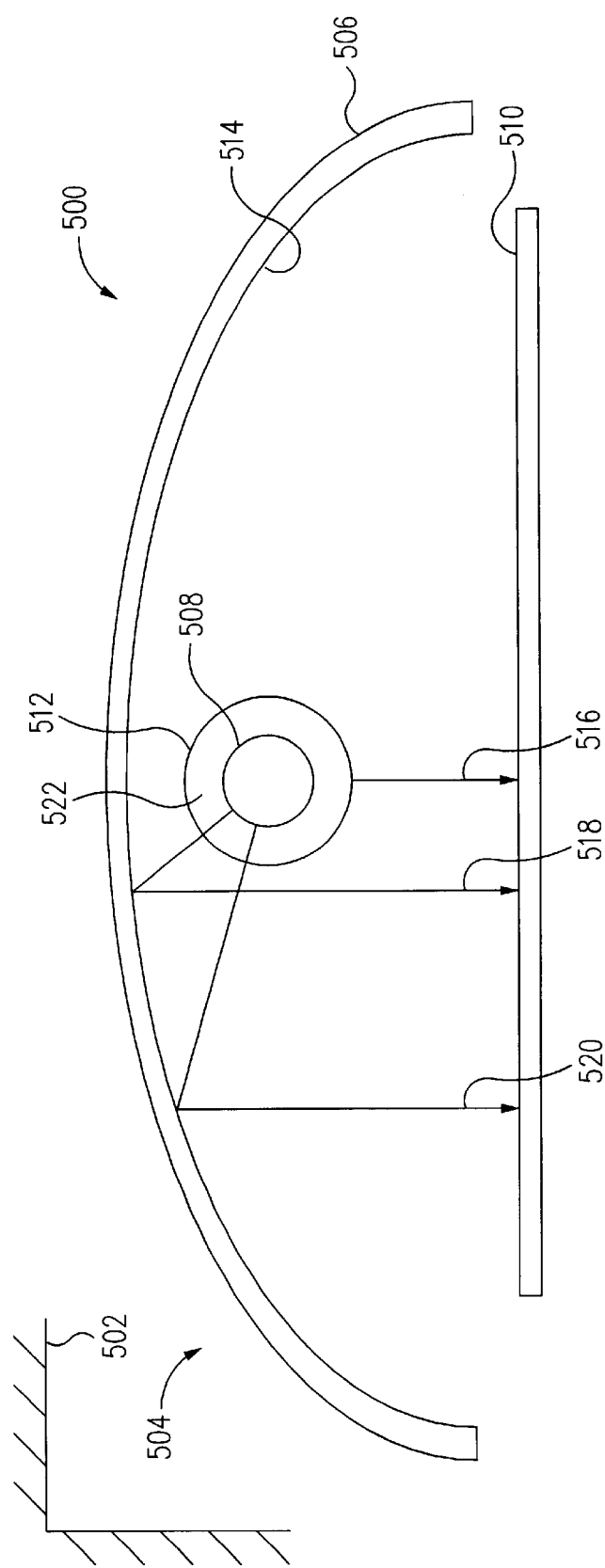

FIG. 5B is a simplified illustration of an alternative embodiment, in which a plurality of lamps 508 are disposed proximate to reflector 506. It should be understood that any number of lamps 508 can be used to achieve the desired heating levels required of a specific process.

Referring again to FIG. 5A, reflector assembly 504 is in operational arrangement with wafer 510. Reflector 506 includes an inner surface 514, which can be highly reflective of certain wavelengths and absorptive or non-reflective of others. In one embodiment, inner surface 514 can be coated with a material, which has the reflecting/absorbing characteristic. For example, inner surface 514 may be coated with gold or silver, where the silver is further coated with a protection coating, such as SiN or any transparent coating, which prohibits oxidation of the silver. The coating efficiently reflects wavelengths of less than 900 nm, to produce an average wavelength of between about 900 nm and about 200 nm. In another embodiment, inner surface is highly reflective across the full spectra of ultra violet (UV), infrared (IR) and visible wavelengths.

Reflector 506 may be formed into any suitable geometric shape. For example, reflector 506 may be flat, spherical, elliptical or parabolic. The light energy from lamp 508 can be focused at the center or focal point of reflector 506 to be directed toward wafer 510. The radiation emitted from lamp 508 and reflected from inner surface 514 of reflector 506 impinges on wafer 510, as simply and representatively illustrated by rays 516, 518 and 520, to provide a uniform temperature distribution across the surface of wafer 510, which heats the active layer 224 of the wafer (as described above in reference to FIG. 2D).

The temperature to which active layer 224 is heated is a function of the relationship between the power supplied to lamp 508 and the length of time which the radiation energy is allowed to impinge on wafer 510. In one embodiment, the temperature of active layer 224 may be raised to a range from between about 500° C. to about 1400° C. To achieve these temperatures, wafer 510 may be exposed to a flash of lamp 508, where lamp 508 gives off light energy suddenly or substantially instantaneously, for example, for a duration of time between about 1 nanosecond and about 10 seconds at a power level of between about 0.5 $J/cm^2$ and about 100 $J/cm^2$.

In another embodiment, after wafer 510 is exposed to the flash of lamp 508, the lamp power can be maintained at a second power level, for example, between about 1000 watts to about 500 kwatts. Wafer 510 can be exposed to the second power level for any time duration that may be necessary to complete the processing of wafer 510. In one example, the continuous exposure can last from between about 0.05 seconds and about 3600 seconds. The continuos exposure can heat the bulk of wafer 510 in addition to heating the active layer during the flash anneal.

Wafer 510 can be pre-heated, for example, to about 300° C., such that the processing of active layer 224 begins at the higher temperature, which reduces processing time and saves energy.

FIG. 6 is a simplified illustration of an alternative embodiment of reflector assembly 504. In this alternative embodiment, reflector 506 may be formed into an ellipse, which has two focal points $F_1$ and $F_2$. Lamp 508 can be positioned at focal point $F_1$, such that the energy is reflected from inner surface 514, exemplified by rays 524 and 525, and focused at the second focal point $F_2$. Wafer 510 can be positioned at focal point $F_2$, such that the energy can be used to process wafer 510.

In this embodiment, the entire wafer surface can be subjected to the energy focused at $F_2$, by moving wafer 510 relative to focal point $F_2$. For example, actuator 526 can be used to provide a conventional means for causing reflector assembly 504 to scan over wafer 510. Actuator 526 may be configured to move either wafer 510 or reflector assembly 504 to provide a back and forth scanning motion, as indicated by arrow 528, across wafer 510.

FIG. 7 is a simplified illustration of another embodiment of reflector assembly 504 in accordance with the present invention. In this embodiment, reflector 506 is formed into an ellipse, with two focal points $F_1$ and $F_2$. Lamp 508 is positioned at focal point $F_1$, such that the energy is reflected from inner surface 514 and focused at focal point $F_2$. In this embodiment, wafer 510 is set back a distance $d_1$ from reflector assembly 504 and/or a distance $d_2$ from focal point $F_2$. Distances $d_1$ and $d_2$ are selected such that wafer 510 is fully engulfed within a beam 533 emanating from focal point $F_2$. Beam 533, outlined by rays 530 and 532, covers the entire surface area of wafer 510, such that the entire surface of wafer 510 is subjected simultaneously to substantially all of the reflected energy from lamp 508 to process wafer 510.

Figure 8:
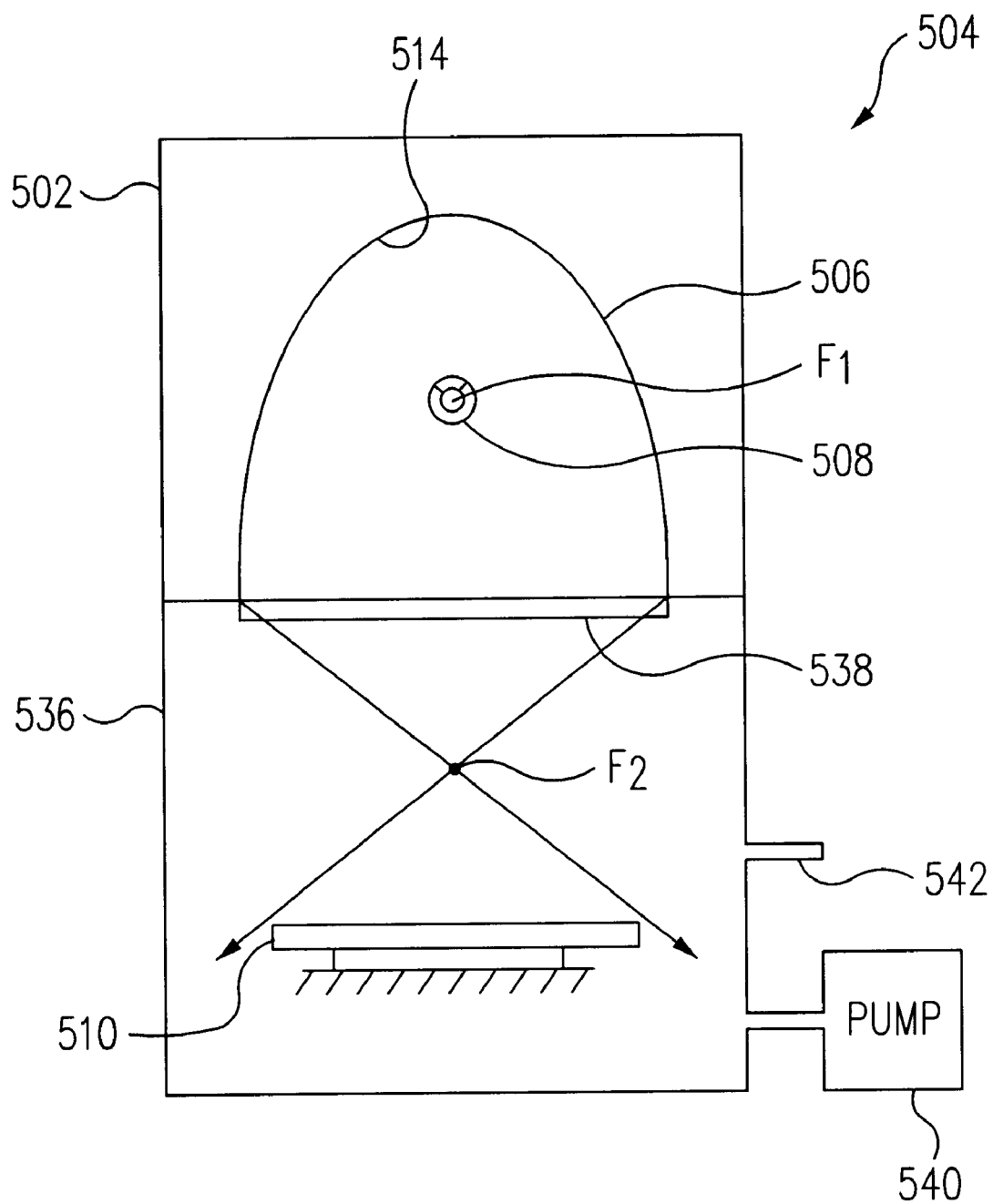
FIG. 8 is a simplified illustration of an alternative embodiment of the reflector assembly of FIG. 6 in accordance with the present invention.

FIG. 8 is a simplified illustration of yet another embodiment of reflector assembly 504 in accordance with the present invention. In this embodiment, process chamber 502 including reflector assembly 504 may be mounted external to a second process chamber 536. Reflector assembly 504 can be positioned above an optical window 538, which is provided between chambers 502 and 536 to allow the radiation energy emitted from lamp 508 to enter second process chamber 536 and impinge on wafer 510. Optical window 538 may be made of any material that allows for the transmission of the radiation energy, preferably quartz. Window 538 may have a thickness of between about 1 and about 5 mm and a diameter that is at least as great or greater than wafer 510.

Second process chamber 536 can be pulled to vacuum, for example, using a pump 540. Second chamber 536 can also be filled through inlet 542 with a non-oxygen gas, such as $N_2$. During the processing of wafer 510, the vacuum or non-oxygen environment ensures that the transmission of ultra-violet (UV) wavelengths from lamp 508 can reach wafer 510.

Although second process chamber 536 with quartz window 538 has been illustrated using the embodiment of reflector assembly 504 of FIG. 7, the second process chamber 536 and quartz window 538 can be used with all of the embodiments of reflector assembly 504 described herein. It should also be understood that chambers 502 and 536 may be a single chamber.

Figure 9A:
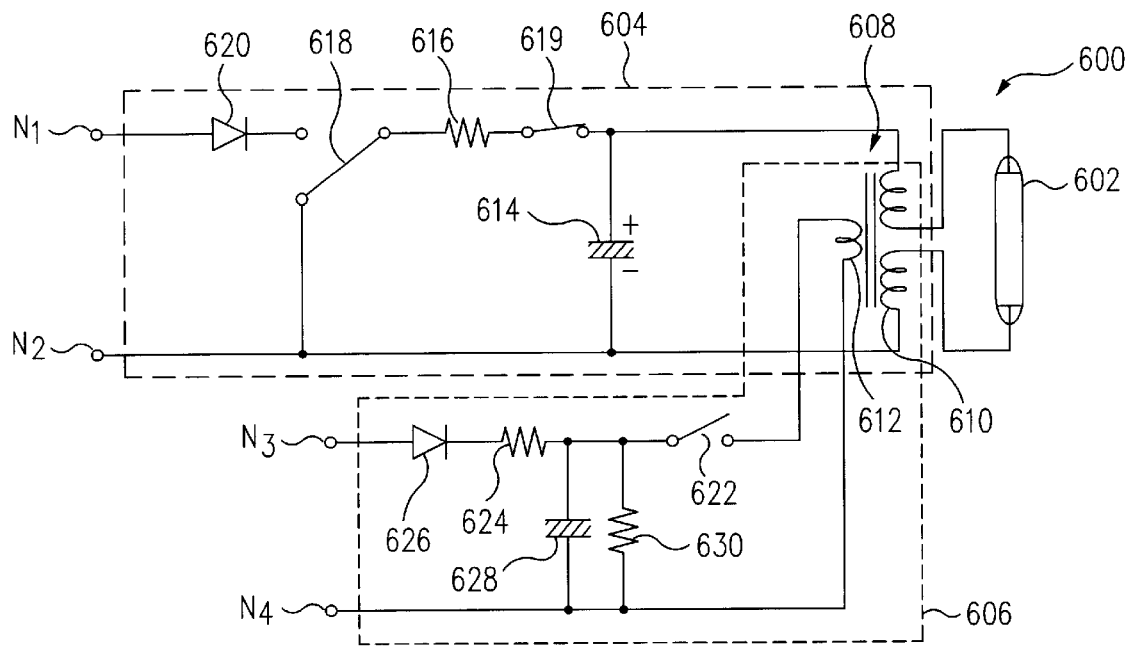
FIGS. 9A–9D are simplified circuit diagrams of a power supply to ignite a lamp in accordance with an embodiment of the present invention.

FIGS. 9A–9D are simplified circuit diagrams of a power supply 600 for a lamp 602 in accordance with an embodiment of the present invention. As shown in FIG. 9A, power supply 600 includes a main circuit 604 and an ignition circuit 606. In one embodiment, main circuit 604 includes an ignition transformer 608 whose primary winding 610 can be supplied with a voltage $V_1$, and whose secondary winding 612 ignites lamp 602 with the stepped-up value of voltage $V_1$. In this embodiment, a capacitor 614 is provided in parallel to a series connection of primary winding 610 and a controllable switch 618. Capacitor 614 can be of any desired capacitance, for example, between about 10 $\mu F$ and 100 F. Switch 618 can be, for example, any suitable manual switch, electromagnetic relay or solid state device.

In this embodiment, capacitor 614 can be connected in parallel with a resistor 616 and a diode 620 provided in series with resistor 616. When charging capacitor 614, resistor 616 acts as a current limiter and/or a dummy load. Capacitor 614 is charged when supply voltage $V_1$ is activated across nodes $N_1$ and $N_2$. Voltage $V_1$ can be an AC voltage supplied via a direct line or a transformer output. Voltage $V_1$ can be adjustable and may range from between about 200 VAC and 1000 VAC.

Ignition circuit 606 supplies the ignition energy with the aid of a pulse switch 622. For this purpose, ignition circuit 606 is provided with secondary winding 612 of ignition transformer 608. A resistor 624, in series with diode 626, is provided in series with secondary winding 612 and pulse switch 622. A capacitor 628, disposed in parallel to a shunt resistor 630, is in series connection to secondary winding 612. Capacitor 628 can be of any desired capacitance, for example, between about 0.5 $\mu F$ and 100 $\mu F$. Capacitor 628 can be charged by a voltage $V_2$, placed across nodes $N_3$ and $N_4$. Voltage $V_2$ can be an AC voltage supplied via a direct line or a transformer output. Voltage $V_2$ can be adjustable and may range from between about 500 VAC and 1000 VAC. Alternatively, for simplicity, nodes $N_1$ and $N_2$ can be electrically coupled to nodes $N_3$ and $N_4$ so as to share the same power source.

Figure 9B:
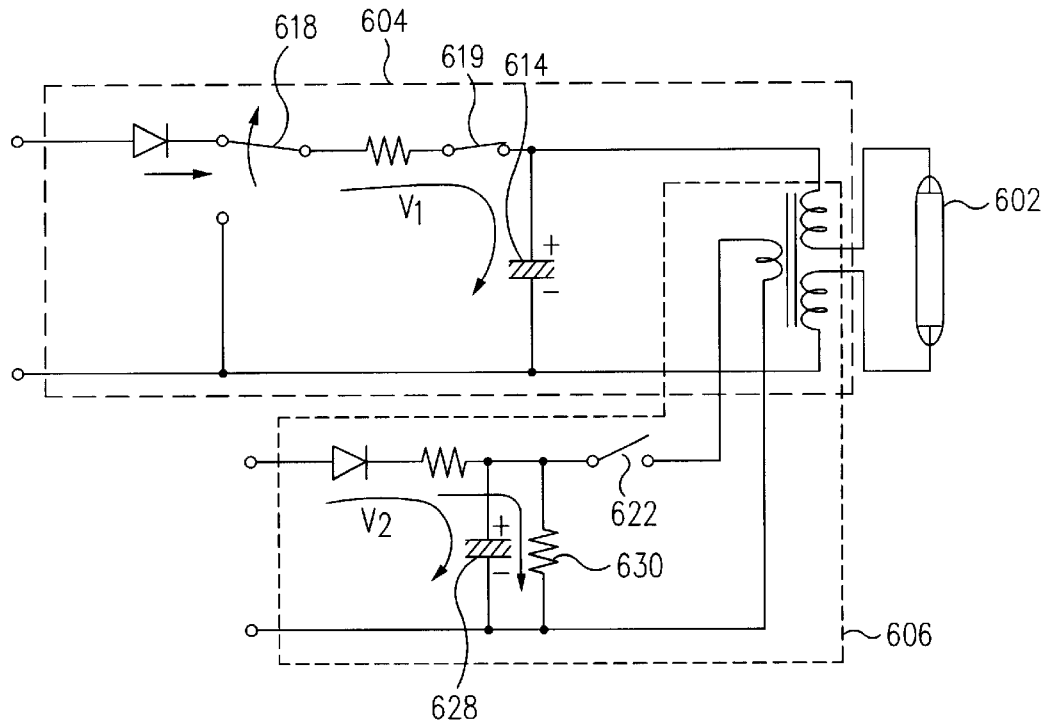

FIG. 9B shows an embodiment of primary circuit 604 and ignition circuit 606 where switches 618 and 619 are closed to allow supply voltage $V_1$ to be applied between nodes $N_1$ and $N_2$, to begin the charging via resistor 616 of capacitor 614. At the same time, capacitor 628 of ignition circuit 606 is charged via resistor 624 with voltage $V_2$ applied between nodes $N_3$ and $N_4$.

Figure 9C:
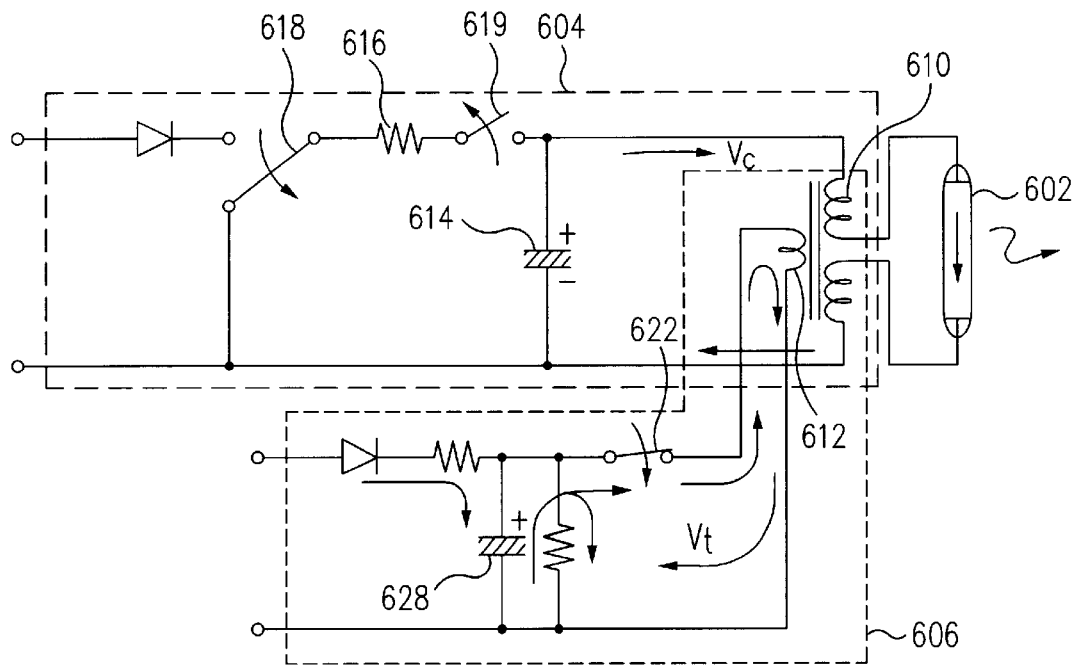

FIG. 9C shows an embodiment, such that when capacitor 614 is charged to a desired capacity, switch 618 can be opened and switch 619 can be opened, thus removing the effect of supply voltage $V_1$ on capacitor 614 and allowing a voltage $V_c$ to be supplied from capacitor 614 across primary windings 610. Impulse switch 622 can be closed to allow capacitor 628 to discharge, such that a voltage $V_t$ is supplied across secondary windings 612. According to the transmission ratio of ignition transformer 608, a current flux generates a stepped-up voltage in primary windings 610 that is high enough to energize lamp 602.

Figure 9D:
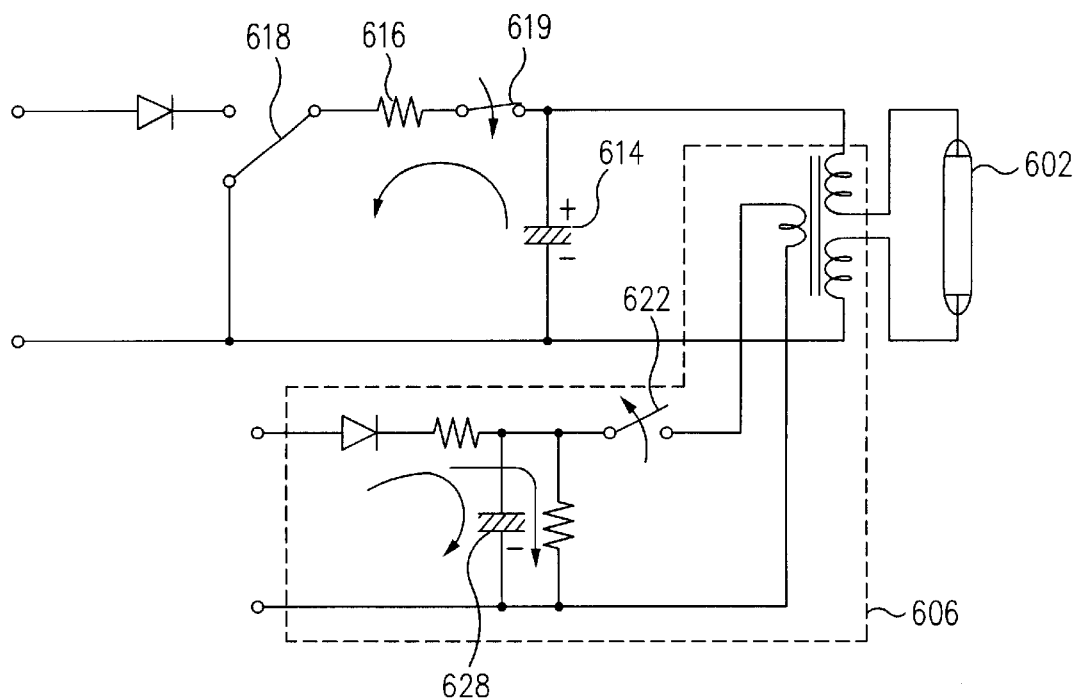

As shown in FIG. 9D, once lamp 602 has been energized as desired, switch 622 can be released (i.e. opened) and switch 619 can be closed to allow capacitor 614 to continue to discharge via the dummy load supplied through resistor 616. In this configuration, capacitor 628 of ignition circuit 606 begins to be re-charged once switch 622 is opened. Primary circuit 604 can be re-charged with the closing of switch 618.

Figure 10:
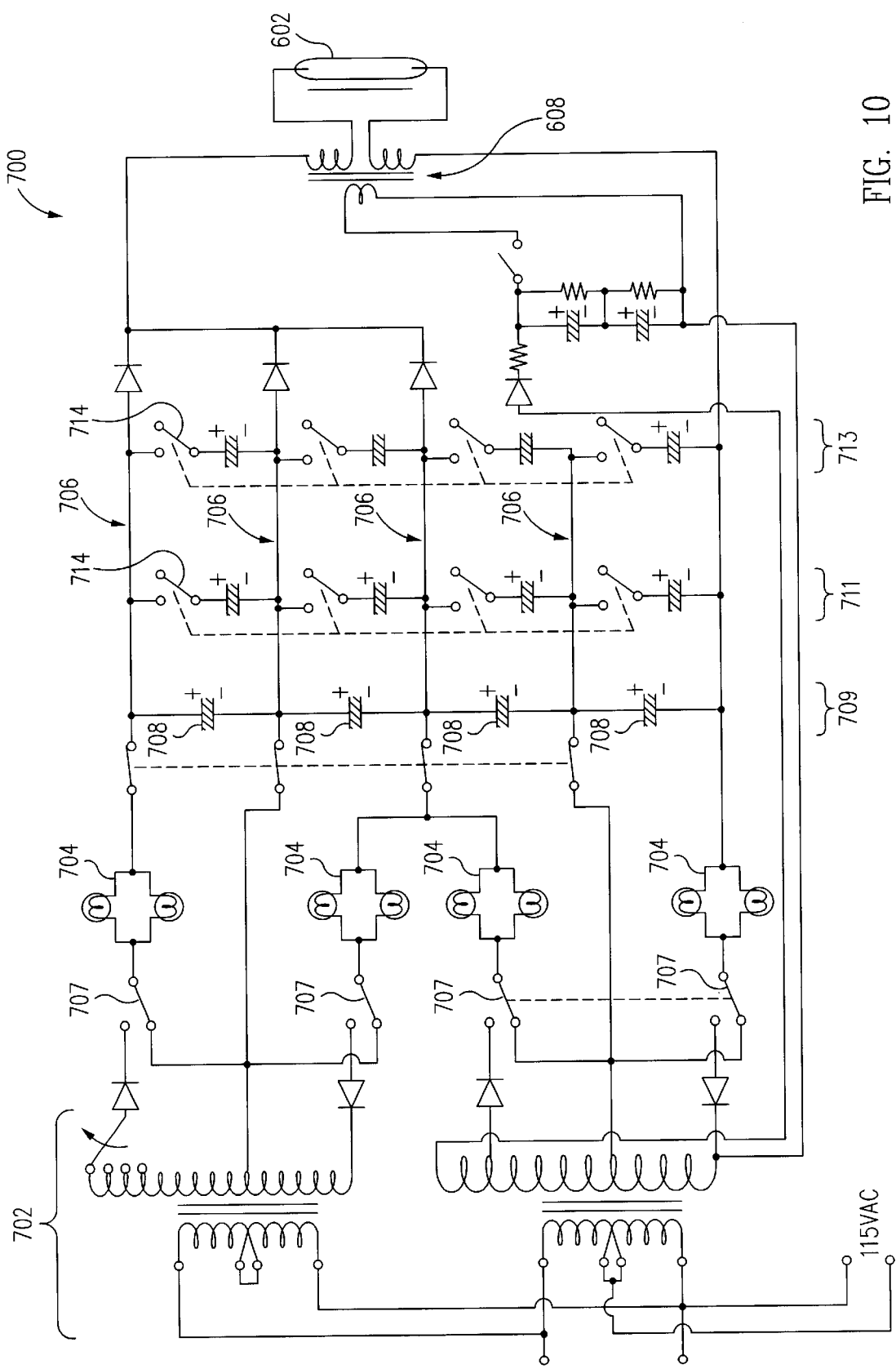
FIG. 10 is an embodiment of a power supply circuit in accordance with the principles of the present invention.

FIG. 10 is an embodiment of a power supply circuit 700 configured using the principles described in reference to FIGS. 9A–9D. This embodiment illustrates the versatility of power supply circuit 700. As best understood with reference to FIG. 10, capacitors 708 from a plurality of primary circuits 706 can be stacked together to be used in conjunction with one another to increase the charge storing capacity of power supply 700. The stacked capacitors 708 form a first rack 709. Each primary circuit 706 can be connected together upon the closing of switches or relays 707. As the capacity of the voltage is increased a plurality of capacitor racks, such as second rack 711 and third rack 713 can be connected in parallel with first rack 709 via a set of switches 714. The racks 709, 711, and 713 can be used together to vary the capacitance and thus the power level supplied to lamp 602.

FIG. 10 illustrates additional versatility of power supply 700. For example, AC power source 702 can be configured to provide a variable voltage, ranging for example between about 200 VAC and about 1000 VAC. In addition, resistor 704 of the primary circuit can be a halogen lamp or similar device, which can be used to dissipate heat energy and also provide a visual indication that the capacitor in the circuit is being charged or discharged.

Figure 11:
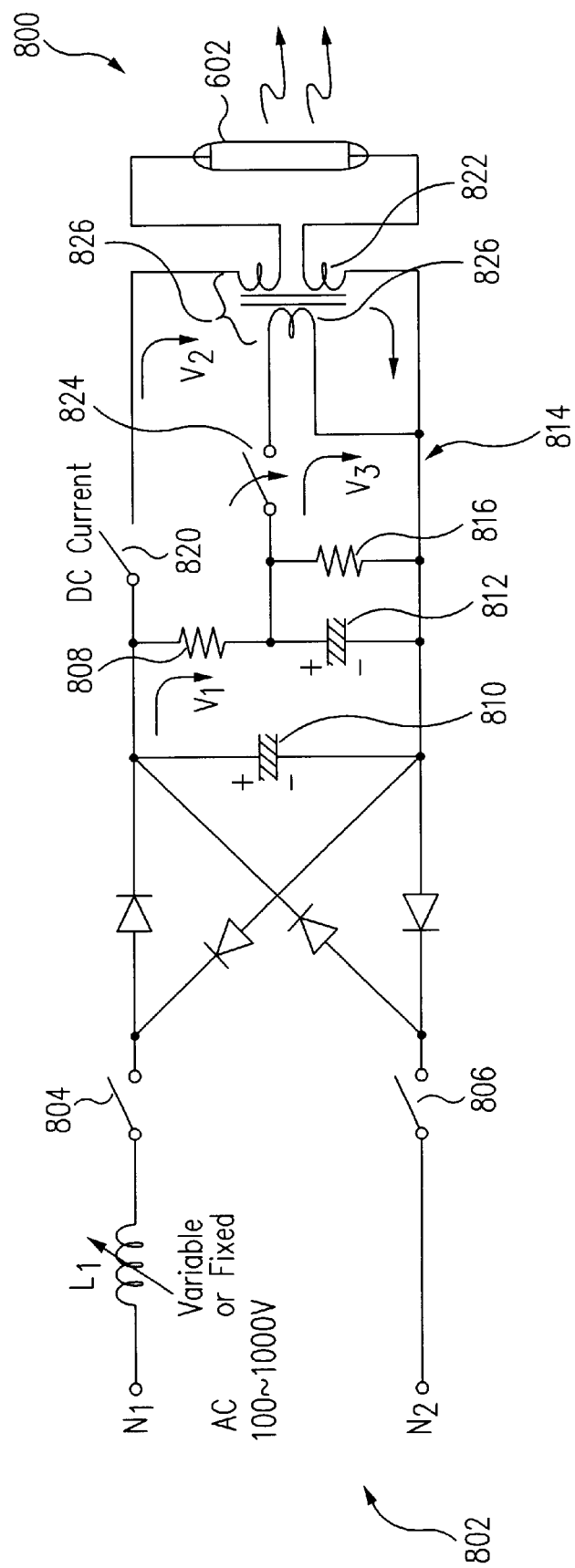
FIG. 11 is an embodiment of a power supply circuit in accordance with the principles of the present invention.

FIG. 11 is an embodiment of a power supply circuit 800 using the principles described in reference to FIGS. 9A–9D with the additional ability to allow a continuous powering of lamp 602. Accordingly, power supply circuit 800 can provide a flash exposure to the radiation energy of lamp 602 followed by a continuous component of exposure to the radiation energy of lamp 602. Power supply circuit 800 includes power circuit 802, where switches 804 and 806 when closed allow an AC supply voltage $V_1$ to be applied between nodes $N_1$ and $N_2$, to begin the charging via resistor 808 of capacitor 810. At the same time, capacitor 812 of ignition circuit 814 is charged via resistor 816. A set of diodes 818 are provided to convert the AC voltage supply to a DC voltage supply. When capacitors 810 and 812 are charged to desired capacities, switch 820 is closed allowing a voltage $V_2$ to be supplied from capacitor 810 across primary windings 822. Impulse switch 824 can be closed to allow capacitor 812 to discharge, such that a voltage $V_3$ is supplied across secondary windings 826. According to the transmission ratio of ignition transformer 826, a current flux generates a stepped-up voltage in primary windings 822 that is high enough to energize lamp 602. Once ignition switch 824 is released, voltage $V_2$ remains across the primary windings to allow lamp 602 to remain energized and, thus producing a radiation energy output. In this manner, discharge time can be controlled.

The present invention overcomes many of the disadvantages of RTP systems using Halogen lamps for heating. For example, filament-type Halogen lamps produce broadband energy, much of which cannot be used to heat the active layer of the wafer. To increase the amount of useable wavelengths in the filament-type lamp, power to the lamp is increased. Unfortunately, this increase in power shifts the peak intensity. The arc lamp used in the present invention does not shift peak intensity with an increase in power and thus can be made to perform at a peak intensity that is within the useable band of wavelengths. As a consequence, the added power is more efficiently consumed at the active layer.

Having thus described embodiments of the present invention, persons skilled in the art will recognize that changes may be made in form and detail without departing from the spirit and scope of the invention. Thus the invention is limited only by the following claims.

What is claimed is:

1. A system for rapid thermal processing of a substrate, said system comprising:

a radiation energy source; and a reflector substantially surrounding said radiation energy source causing radiation energy to impinge on a surface of a substrate, said radiation energy source configured to be flashed to suddenly heat an active layer of said substrate, said radiation energy including an average power of between about 0.5 J/cm$^2$ and about 100 J/cm$^2$.

2. A system for rapid thermal processing of a substrate, said system comprising:

a radiation energy source; and a reflector substantially surrounding said radiation energy source causing radiation energy to impinge on a surface of a substrate, said radiation energy source configured to be flashed to suddenly heat an active layer of said substrate, said active layer including a portion of said substrate between 10 nm and about 1 mm below said surface of said substrate.

3. The system of claim 2, wherein a temperature of said active layer is between about 500° C. and 1400° C.

4. The system of claim 2, wherein said flash to suddenly heat comprises a substantially instantaneous reaction time of between about 1 nanosecond and about 10 seconds.

5. The system of claim 2, wherein said reflector comprises an inner surface which has been coated with a material taken form the group consisting of gold and silver.

6. The system of claim 2, wherein said reflector reflects wavelengths of less than about 900 nm.

7. The system of claim 2, wherein said reflector has a geometric shape taken from the group consisting of a plane, a sphere, a parabola, and an ellipse.

8. The system of claim 2, wherein said radiation energy source comprises a plurality of high intensity lamps.

9. The system of claim 2, wherein said reflector focuses said radiation energy at a first focal point, said first focal point on said surface of said substrate.

10. The system of claim 2, wherein said reflector focuses said radiation energy at a first focal point, wherein said first focal point emits a radiation energy beam which impinges on said surface of said substrate.

11. The system of claim 10, wherein said substrate is housed in a non-oxygenated environment.

12. A system for rapid thermal processing of a substrate, said system comprising:

a chamber;

at least one radiation energy source disposed in said chamber; and a reflector assembly substantially surrounding said at least one radiation energy source, said reflector assembly including a reflective surface for focusing radiation energy from said radiation energy source at a first focal point to impinge on a surface of a substrate for a substantially instantaneous time of between about 1 nanosecond and about 10 seconds to raise the temperature of an active layer of said substrate during said substantially instantaneous time to between about 500° C. and about 1400° C., said active layer including a portion of said substrate between 10 nm and about 1 mm below a surface of said substrate.

13. A method for rapid thermal processing of a substrate, said method comprising:

providing a chamber including a radiation energy source and a reflector; and flashing said radiation energy source so as to impinge on a surface of a substrate for a substantially instantaneous time to heat an active layer of said substrate, said radiation energy including an average power of between about 0.5 J/cm$^2$ and about 100 J/cm$^2$.

14. A method for rapid thermal processing of a substrate, said method comprising:

providing a chamber including a radiation energy source and a reflector; and flashing said radiation energy source so as to impinge on a surface of a substrate for a substantially instantaneous time to heat an active layer of said substrate, said active layer including a portion of said substrate between 10 nm and about 1 mm below a surface of said substrate.

15. The method of claim 14, wherein a temperature of said active layer is between about 500° C. and 1400° C.

16. The method of claim 14, wherein said substantially instantaneous time is between about 1 nanosecond and about 10 seconds.

17. The method of claim 14, wherein said reflector comprises an inner surface which has been coated with a material taken form the group consisting of gold and silver.

18. The method of claim 14, wherein said reflector reflects wavelengths of less than about 900 nm.

19. The method of claim 14, wherein said reflector has a geometric shape taken form the group consisting of a plane, a sphere, a parabola, and an ellipse.

20. The method of claim 14, wherein said focusing comprises emitting a radiation energy beam of said focused radiation energy from said first focal point to a surface of said substrate.

21. A method for rapid thermal processing of a substrate, said method comprising:

providing a chamber including a radiation energy source and a reflector;

raising the power level of said radiation energy source to a peak power level to expose an active layer of a substrate to a first radiation energy for a first substantially instantaneous time duration; and thereafter maintaining a second power level of said radiation energy source, less than said first power level, to expose a bulk of said substrate to a second radiation energy for a second time duration, said first time duration being between about 1 nanosecond and about 10 seconds and said second time duration being between about zero seconds and about 3600 seconds.

22. The method of claim 21, wherein said radiation energy source comprises a high-intensity lamp.

23. The method of claim 21, wherein said radiation energy comprises an average power of between about 0.5 J/cm$^2$ and about 100 J/cm$^2$.

24. The method of claim 21, wherein said active layer comprises a portion of said substrate between 10 nm and about 1 mm below a surface of said substrate.

25. The system of claim 2, wherein said radiation energy source comprises a high-intensity lamp.

26. The system of claim 25, wherein said high intensity lamp comprises a flow tube including a cooling fluid.

27. The system of claim 25, wherein said high-intensity lamp is selected from the group including a Xe, Argon and Krypton arc lamp.

28. The system of claim 2, wherein said radiation energy comprises an average power of between about 0.5 J/cm$^2$ and about 100 J/cm$^2$.

29. The system of claim 12, wherein said first focal point is disposed on said surface of said substrate.

30. The system of claim 12, wherein an energy flux emanating from said first focal point impinges on said surface of said substrate.

31. The system of claim 12, wherein said radiation energy source comprises a high intensity lamp selected from the group consisting of Xe, Argon and Krypton arc lamps.

32. The method of claim 14, wherein said radiation energy source comprises a high-intensity lamp.

33. The method of claim 32, wherein said high intensity lamp comprises a flow tube including a cooling fluid.

34. The method of claim 32, wherein said high-intensity lamp is selected from the group consisting of Xe, Argon and Krypton arc lamps.

* * * * *

UNITED STATES PATENT AND TRADEMARK OFFICE
CERTIFICATE OF CORRECTION

PATENT NO. : 6,376,806 B2
DATED : April 23, 2002
INVENTOR(S) : Yoo, Woo Sik

It is certified that error appears in the above-identified patent and that said Letters Patent is hereby corrected as shown below:

<u>Title page,</u>
Item [73], insert as follows:
-- [73]  Assignee:  WaferMasters, Inc.,
                      San Jose, California --

Signed and Sealed this

Eighth Day of April, 2003

JAMES E. ROGAN
*Director of the United States Patent and Trademark Office*